US011272650B2

(12) United States Patent
Kawai

(10) Patent No.: US 11,272,650 B2
(45) Date of Patent: Mar. 8, 2022

(54) COMPONENT MOUNTING MACHINE AND COMPONENT MOUNTING METHOD

(71) Applicant: FUJI CORPORATION, Chiryu (JP)

(72) Inventor: Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/638,597

(22) PCT Filed: Aug. 31, 2017

(86) PCT No.: PCT/JP2017/031478
§ 371 (c)(1),
(2) Date: Feb. 12, 2020

(87) PCT Pub. No.: WO2019/043892
PCT Pub. Date: Mar. 7, 2019

(65) Prior Publication Data
US 2020/0221618 A1 Jul. 9, 2020

(51) Int. Cl.
*H05K 13/08* (2006.01)
*H05K 13/04* (2006.01)

(52) U.S. Cl.
CPC ..... *H05K 13/0818* (2018.08); *H05K 13/0404* (2013.01); *H05K 13/0812* (2018.08); *H05K 13/0815* (2018.08)

(58) Field of Classification Search
CPC ........... H05K 13/0818; H05K 13/0812; H05K 13/0815; H05K 13/0404
See application file for complete search history.

(56) References Cited

U.S. PATENT DOCUMENTS 5,694,219 A * 12/1997 Kim .................. H05K 13/0812
356/615
6,538,425 B1  3/2003 Kawada
(Continued)

FOREIGN PATENT DOCUMENTS

JP  2001-223500 A  8/2001
JP  2001-251098 A  9/2001
(Continued)

OTHER PUBLICATIONS

International Search Report dated Dec. 5, 2017 in PCT/JP2017/031478 filed Aug. 31, 2017, 2 pages.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounting machine including a mounting head configured to pick up and mount a component; a component camera to image the component from below the mounting head; a board camera to image the circuit board from above; an imaging position memory to memorize imaging position coordinates during imaging, based on images acquired by the component camera; a relative position memory to memorize relative position coordinates that are a relative position of the mounting head with respect to the board camera; and a correction necessity determining section to perform imaging of the mounting head by the component camera when the moving device has arrived at the imaging position coordinates, and determine whether it is necessary to correct the relative position coordinates memorized in the relative position memory, based on a position of the mounting head understood from the images acquired from the imaging.

5 Claims, 9 Drawing Sheets

(56) References Cited

U.S. PATENT DOCUMENTS

2002/0092161 A1* 7/2002 Yoshii ............... H05K 13/0815
  29/833
2014/0300730 A1* 10/2014 Onishi ............... H05K 13/0818
  348/95

FOREIGN PATENT DOCUMENTS

| JP | 2007-188994 A | 7/2007 | |
| JP | 2007-235019 A | 9/2007 | |
| JP | 2011-124461 A | 6/2011 | |
| JP | 2011124461 A * | 6/2011 | |
| JP | 5779386 B2 * | 9/2015 | ......... H05K 13/0812 |

* cited by examiner

COMPONENT MOUNTING MACHINE AND COMPONENT MOUNTING METHOD

TECHNICAL FIELD

The present disclosure relates to a component mounting machine and a component mounting method.

BACKGROUND ART

A component mounting machine provided with a mounting head, a component camera, and a board camera is known. In such a component mounting machine, a component supplied to a component supply position is picked up by a mounting head, and in the process of mounting the picked-up component on a circuit board, the component picked up by the mounting head is imaged by a component camera, and the positioned circuit board is imaged by a board camera. Further, the component mounting machine corrects the positional deviation of the mounting head in performing positioning control of the mounting head with respect to the imaging positions of the component camera and the board camera.

For example, patent literature 1 discloses technology for eliminating the influences of thermal deformation by performing positional correction of the mounting head and positional correction of the recognition origin of a line camera whenever the consecutive mounting time is equal to or longer than a preset time. Further, patent literature 2 discloses technology for measuring a movement error of a head unit due to thermal expansion or the like by comparing an interval on an image between a pair of marks imaged by a board recognizing camera with a reference value of an interval of a pair of marks stored in advance, and correcting a movement target position of a head unit based on the movement error.

CITATION LIST

Patent Literature

Patent literature 1: JP-A-2007-235019
Patent literature 2: JP-A-2001-251098

BRIEF SUMMARY

Technical Problem

However, the amount of thermal deformation of the component mounting machine changes with the elapsed time from the start of component mounting operation. In this regard, with the technology described in patent literature 1, the longer the set time, the larger the positional deviation of the mounting head, and the lower the mounting accuracy of the component, while the shorter the set time, the higher the frequency of correcting the positional deviation of the mounting head, and the less efficient the component mounting operation.

It is an object of the present disclosure to provide a component mounting machine and a component mounting method capable of efficiently performing a component mounting operation while maintaining a component mounting accuracy.

Solution to Problem

Disclosed herein is a component mounting machine including: a moving device configured to move between a component supply position and a circuit board; a mounting head provided on the moving device and configured to pick up a component supplied to the component supply position and mount the picked-up component on the circuit board; a component camera configured to image the component held by the mounting head from below the mounting head; a board camera provided on the moving device and configured to image the circuit board from above; an imaging position memory section configured to memorize imaging position coordinates that are position coordinates of the moving device during imaging by the component camera, based on image data acquired by imaging of the mounting head by the component camera; a relative position memory section configured to memorize relative position coordinates that are a relative position of the mounting head with respect to the board camera; and a correction necessity determining section configured to perform imaging of the mounting head by the component camera when the moving device has arrived at the imaging position coordinates, and determine whether it is necessary to correct the relative position coordinates memorized in the relative position memory section, based on a position of the mounting head understood from image data acquired from the imaging.

Further disclosed is a component mounting method for a component mounting machine including a moving device configured to move between a component supply position and a circuit board, a mounting head provided on the moving device and configured to pick up a component supplied to the component supply position and mount the picked-up component on the circuit board, a component camera configured to image the component held by the mounting head from below the mounting head, and a board camera provided on the moving device and configured to image the circuit board from above. The component mounting method includes: an imaging position coordinates memory process of memorizing imaging position coordinates that are position coordinates of the moving device during imaging by the component camera, based on image data acquired by imaging of the mounting head by the component camera; a relative position coordinates memory process of memorizing relative position coordinates that are a relative position of the mounting head with respect to the board camera; a component imaging process of performing imaging of the mounting head using the component camera when the moving device has arrived at the imaging position coordinates; and a correction necessity determining process of determining whether it is necessary to correct the relative position coordinates, based on a position of the mounting head understood from image data acquired from the imaging of the component imaging process.

Advantageous Effects

According to a component mounting machine of the present disclosure, the correction necessity determining section performs imaging of the mounting head using the component camera when the moving device arrives at the imaging position coordinates, and determines whether it is necessary to correct the relative position coordinates based on the position of the mounting head understood from the image data acquired by the imaging. Here, since the component mounting machine corrects the relative position coordinates at an appropriate time, component mounting operation is efficiently performed while maintaining the component mounting accuracy.

Further, according to a component mounting method of the present disclosure, a correction necessity determining process determines whether it is necessary to correct the relative position coordinates based on the position of the mounting head understood from the image data acquired by the imaging. Here, since the component mounting method corrects the relative position coordinates at an appropriate time, component mounting operation is efficiently performed while maintaining the component mounting accuracy.

DESCRIPTION OF EMBODIMENTS

1. Overall Configuration of Component Mounting Machine 1

Embodiments to which a component mounting machine and a component mounting method disclosed in this specification are applied are described below referring to the figures. First, referring to FIG. 1, a schematic configuration of component mounting machine 1 according to an embodiment will be described.

Figure 1:
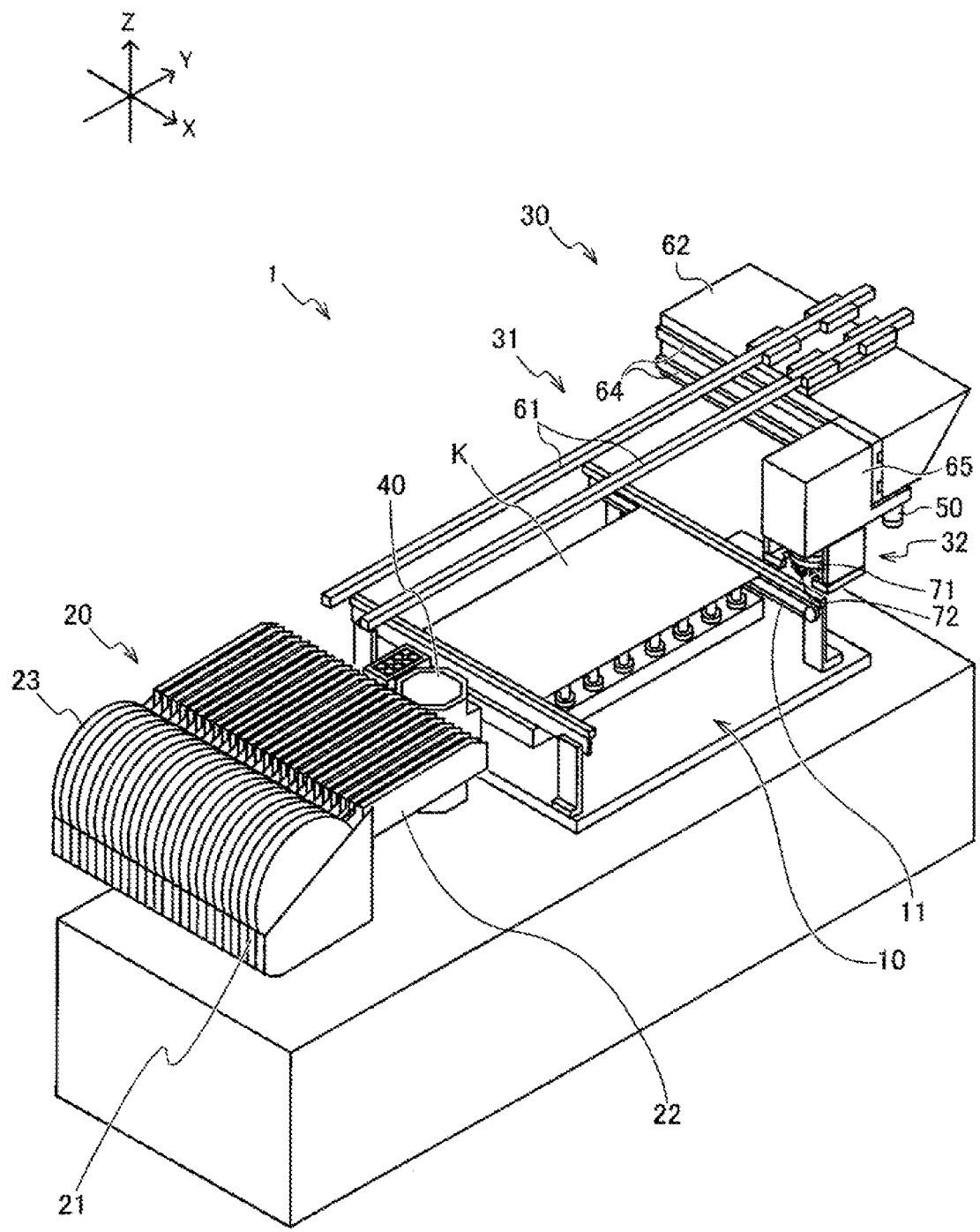
FIG. 1 is a perspective view of a component mounting machine of an embodiment of the disclosure.
Figure 4:
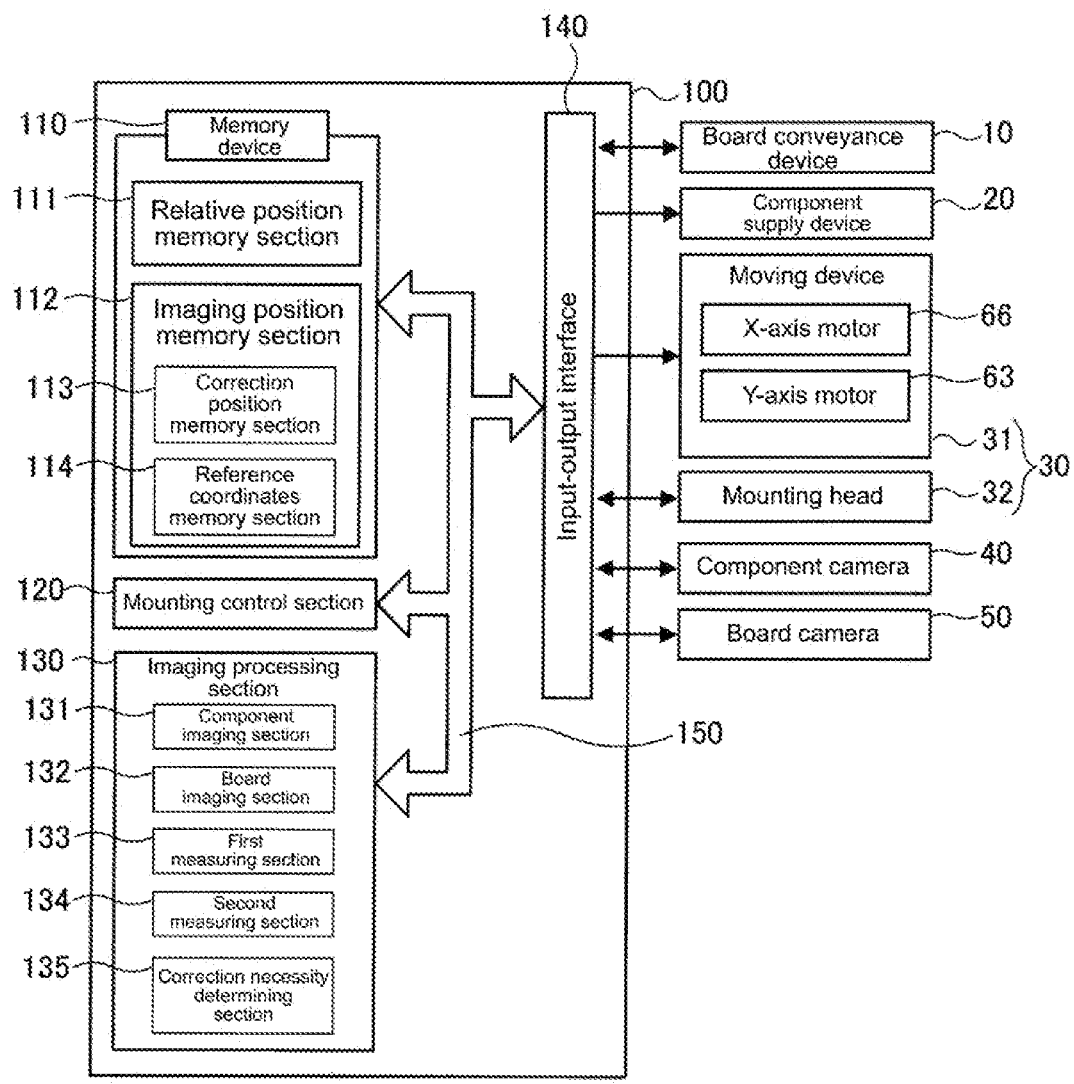
FIG. 4 is a block diagram of a control device.

As shown in FIG. 1, component mounting machine 1 is provided mainly with board conveyance device 10, component supply device 20, component transfer device 30, component camera 40, board camera 50, and control device 100 (refer to FIG. 4). In descriptions below, the left-right direction of component mounting machine 1 is defined as the X-axis direction, the front-rear direction is defined as the Y-axis direction, and the vertical direction is defined as the Z-axis direction.

Board conveyance device 10 is configured from a pair of belt conveyors 11 and the like arranged in the X-axis direction. Board conveyance device 10 sequentially conveys loaded circuit boards K in the X-axis direction, and positions the circuit board K conveyed to a specified position. Further, when component mounting processing onto the positioned circuit board K is completed, board conveyance device 10 unloads the circuit board K from component mounting machine 1.

Component supply device 20 supplies components P to be mounted on circuit board K. Component supply device 20 includes multiple slots 21 arranged lined up in the X-axis direction. Component supply device 20 further includes multiple feeders 22 interchangeably set to each of the multiple slots 21. Feeder 22 feeds carrier tape wound around reel 23 to supply components P stored in the carrier tape to a component supply position provided on the front end side of feeder 22 (that is, on the upper right side in FIG. 1).

Component transfer device 30 collects component P supplied by component supply device 20 and mounts the collected component P on the positioned circuit board K. Component transfer device 30 mainly includes moving device 31 and mounting head 32.

Moving device 31 includes pair of Y-axis guide rails 61, Y-axis slider 62, Y-axis motor 63 (refer to FIG. 4), pair of X-axis guide rails 64, X-axis slider 65, and X-axis motor 66 (refer to FIG. 4). The pair of Y-axis guide rail members 61 are elongated members extending in parallel to each other in the Y-axis direction. Y-axis slider 62 is arranged between the pair of Y-axis guide rails 61 and driven by Y-axis motor 63 so as to be movable in the Y-axis direction. The pair of X-axis guide rail members 64 are elongated members extending in parallel to each other in the X-axis direction. X-axis slider 65 is attached to the pair of X-axis guide rails 64, and is driven by X-axis motor 66 in the X-axis direction.

Mounting head 32 mainly includes head main body 71 and component holding section 72. Head main body 71 is detachably mounted on X-axis slider 65. Component holding section 72 is a suction nozzle capable of holding component P, and collects component P supplied to the component supply position (see FIG. 8), and mounts the collected component P on circuit board K.

Figure 2:
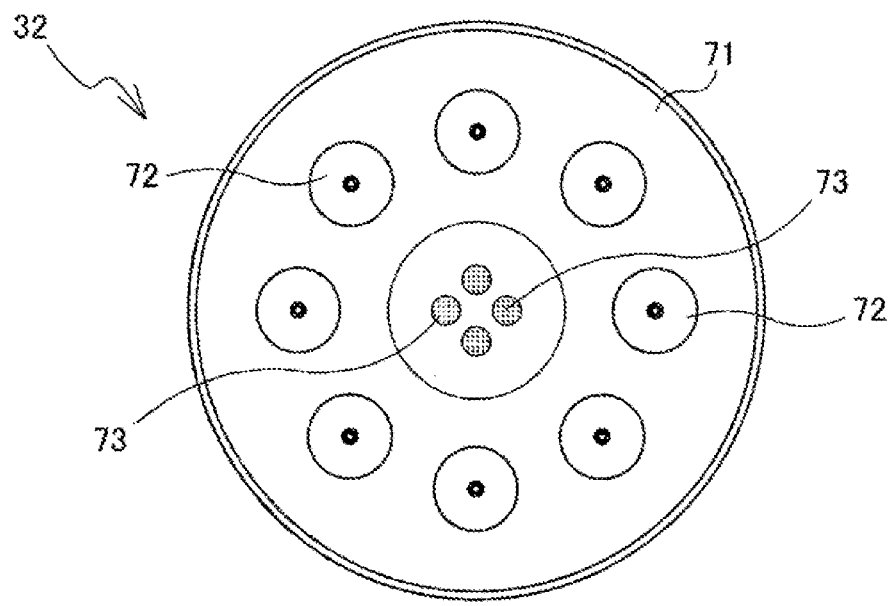
FIG. 2 is a view of a mounting head from below.

Further, as shown in FIG. 2, head mark 73 consisting of four circular marks is provided on a lower surface of head main body 71. Head mark 73 serves as a reference position of mounting head 32 when image processing of the image data acquired by imaging by component camera 40 is performed.

Returning to descriptions of FIG. 1. Component camera 40 and board camera 50 are digital cameras with an imaging element such as a charge coupled device (CCD) or a complementary metal oxide semiconductor (CMOS). Component camera 40 and board camera 50 capture an image of an area within the camera field of view based on control signals from control device 100 communicably connected thereto, and transmit the image data acquired by the imaging to control device 100. Component camera 40 is an imaging device capable of imaging component P picked up by mounting head 32 from below mounting head 32. Component camera 40 is fixed to the base of component mounting machine 1 such that the optical axis is in the Z-axis direction, and captures an image of component P held by mounting head 32 from below. Board camera 50 is an imaging device capable of capturing an image of the circuit board K from above. Board camera 50 is fixed to X-axis slider 65 such that the optical axis is in the Z-axis direction at a position separated from mounting head 32.

Figure 3:
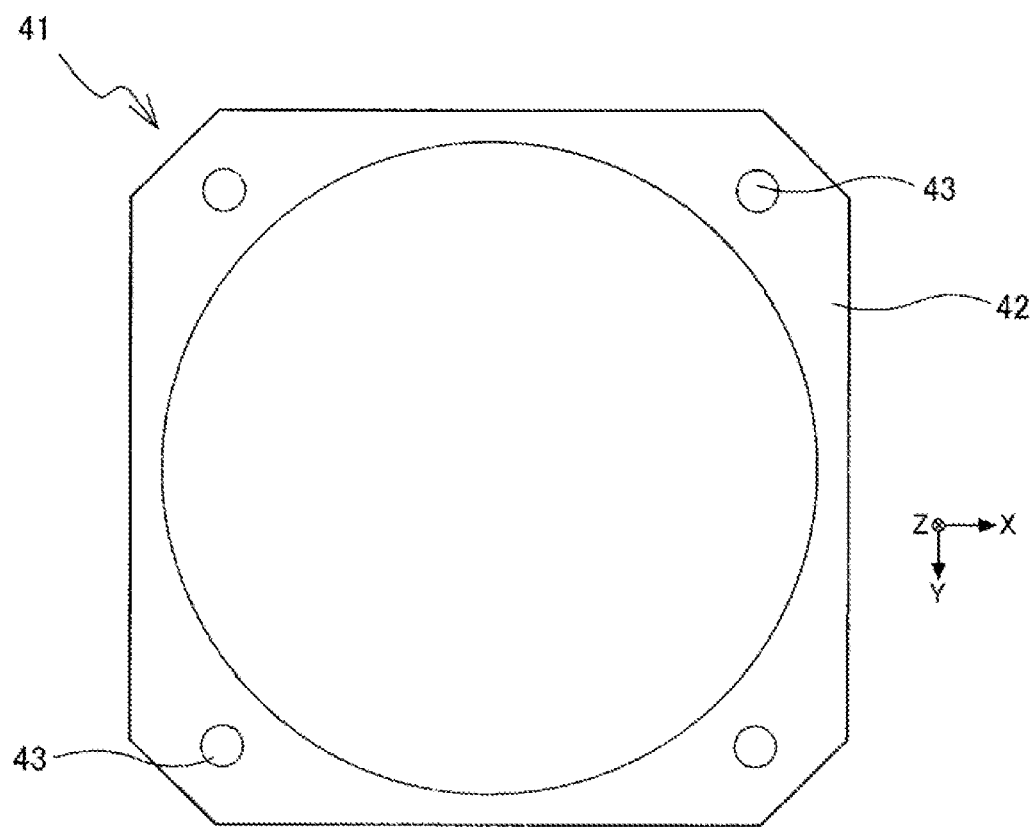
FIG. 3 is a view of a component camera from above.

As shown in FIG. 3, component camera 40 includes lens unit 41 and cover 42 covering an upper portion of lens unit 41. Circular reference marks 43 are provided at each of the four corners of cover 42, and cover 42 is arranged at a position where the center of the four reference marks 43 coincides with the optical axis of component camera 40. Also, the four reference marks 43 fit in the camera field of view of component camera 40.

As shown in FIG. 4, control device 100 includes CPU, various memory, and the like. Control device 100 includes memory device 110, mounting control section 120, image processing section 130, and input-output interface 140. Memory device 110, mounting control section 120, image processing section 130, and input-output interface 140 are connected to each other via bus 150.

2. Control Device 100

Control device 100 receives detection signals from various motors of moving device 31, detection signals from various motors and various sensors of mounting head 32, and image signals from component camera 40 and board camera 50 via input-output interface 140. In addition, mounting control section 120 and image processing section 130 output various control signals and the like to the various motors of board conveyance device 10, component supply device 20, and moving device 31, and to the various motors and sensors of mounting head 32, and to component camera 40 and board camera 50, via mounting control section 140.

Memory device 110 is configured by an optical drive device such as a hard disk drive, flash memory, or the like. Memory device 110 stores control programs, control information, image data obtained by imaging by component camera 40 and board camera 50, and the like.

Mounting control section 120 outputs control signals to board conveyance device 10, component supply device 20, and component transfer device 30 based on the control program and control information stored in memory device 110, information from the various sensors, and results of image processing and recognition processing. Further, mounting control section 120 controls the position and rotational angle of mounting head 32 and component holder 72. Specifically, mounting control section 120 receives information outputted from various motors, various sensors, and the like, and the results of various recognition processing, and the like.

Image processing section 130 mainly includes component imaging section 131 and board imaging section 132. Component imaging section 131 controls imaging by component camera 40. Then, component imaging section 131 acquires the image data obtained by imaging using component camera 40, and confirms the holding position, the orientation, and the like of component P held by component holding section 72.

Board imaging section 132 controls imaging by board camera 50. Board imaging section 132 acquires image data obtained by imaging using board camera 50, recognizes board marks (not shown) provided on circuit board K, and thereby grasps the positioning status of circuit board K. Next, mounting control section 120 corrects the position of moving device 31 when the mounting head 32 mounts component P on circuit board K based on the positioning status of circuit board K.

Memory device 110 further includes relative position memory section 111 and imaging position memory section 112. Relative position memory section 111 stores relative position coordinates, which are the relative position of mounting head 32 with respect to board camera 50, more specifically, relative position coordinates of head marks 73 with respect to the optical axis of board camera 50. The relative position coordinates are used when mounting control section 120 calculates the mounting position of component P with respect to circuit board K. That is, since mounting head 32 and board camera 50 are arranged side by side on moving device 31, the position of moving device 31 when the component P is mounted on the circuit board K is calculated in consideration of the relative position coordinates of component holding unit 72 with respect to board camera 50.

However, component transfer device 30 is easily thermally deformed in accordance with the mounting operation of components P by component mounting machine 1, and the distance between the optical axis of board camera 50 and the center of component holding portion 72 is changed by the effect of the thermal deformation of component transfer device 30.

For this, image processing section 130 includes first measuring section 133 for measuring relative position coordinates which are a relative position of mounting head 32 with respect to board camera 50. First measuring section 133 measures the relative position coordinates during processing of performing mounting of components P by component mounting machine 1, and corrects the relative position coordinates stored in relative position memory section 111.

Imaging position memory section 112 stores imaging position coordinates, which are position coordinates of moving device 31 when imaging mounting head 32 with component camera 40. Specifically, in imaging position memory section 112, the position coordinates of moving device 31 when mounting head 32 is arranged so that the optical axis of component camera 40 coincides with head marks 73 are stored as the imaging position coordinates. After all the components P to be collected have been collected by component holding section 72, control device 100 performs control using mounting control section 120 when capturing an image of the component P held by component holding section 72 using component camera 40, and moves moving device 31 to the image capturing position coordinates.

However, the thermal deformation of component transfer device 30 also affects the distance from the supply position of component P by component supply device 20 to the imaging position of component camera 40. In other words, as mounting operations of components P by component mounting machine 1 proceed, the distance from the component supply position to the imaging position of component camera 40 changes. As a result, even if moving device 31 is moved to the imaging position coordinates, a positional deviation occurs between the optical axis of component camera 40 and head marks 73, and the positional deviation increases as operation time of components P elapses.

For this, image processing section 130 includes second measuring section 134 for measuring the positional deviation between the optical axis of component camera 40 and head marks 73. Second measuring section 134 measures the positional deviation between the optical axis of component camera 40 and head marks 73 during processing of mounting components P by component mounting machine 1, and corrects the imaging position coordinates stored in imaging position memory section 112. Specifically, second measuring section 134 measures the positional deviation between the actual position of head mark 73 of mounting head 32, which is grasped from the image data obtained by imaging using component camera 40, and the position of head marks 73 of mounting head 32, which is calculated based on the imaging position coordinate stored in imaging position memory section 112.

3. Correction of Reference Position Coordinates

Here, an example of a procedure for correcting the reference position coordinates performed by first measuring section 133 will be described with reference to FIGS. 5 to 7. In the following, the field of view of component camera 40 and the field of view of board camera 50 are illustrated by single-dash broken lines and double-dash broken lines respectively.

Figure 5:
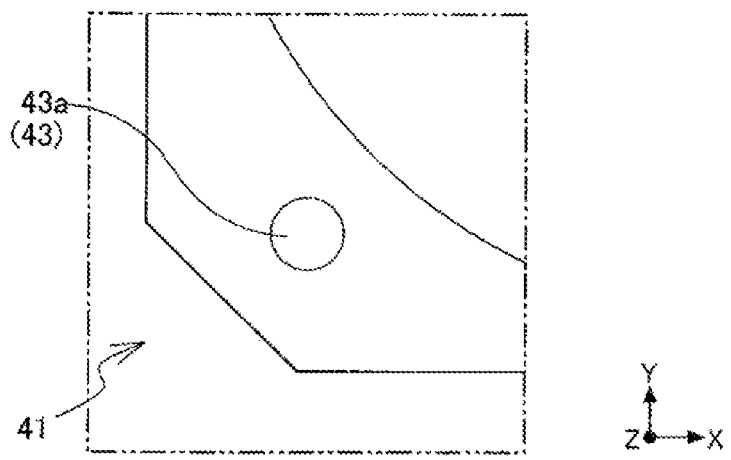
FIG. 5 shows the camera field of view of the board camera when imaging is performed by the board camera with the optical axis of the board camera coaxial with a reference mark.

As shown in FIG. 5, when the reference position coordinates are measured, first, control device 100 performs control using board imaging section 132, and images one reference mark 43 attached to component camera 40 by board camera 50. Here, control device 100, via mounting control section 120, performs control to move moving device 31 to a position where the optical axis of board camera 50 coincides with the center of reference marks 43. As a result, the position of board camera 50 as viewed from component camera 40 becomes constant regardless of the thermal deformation generated in component transfer device 30.

Figure 6:
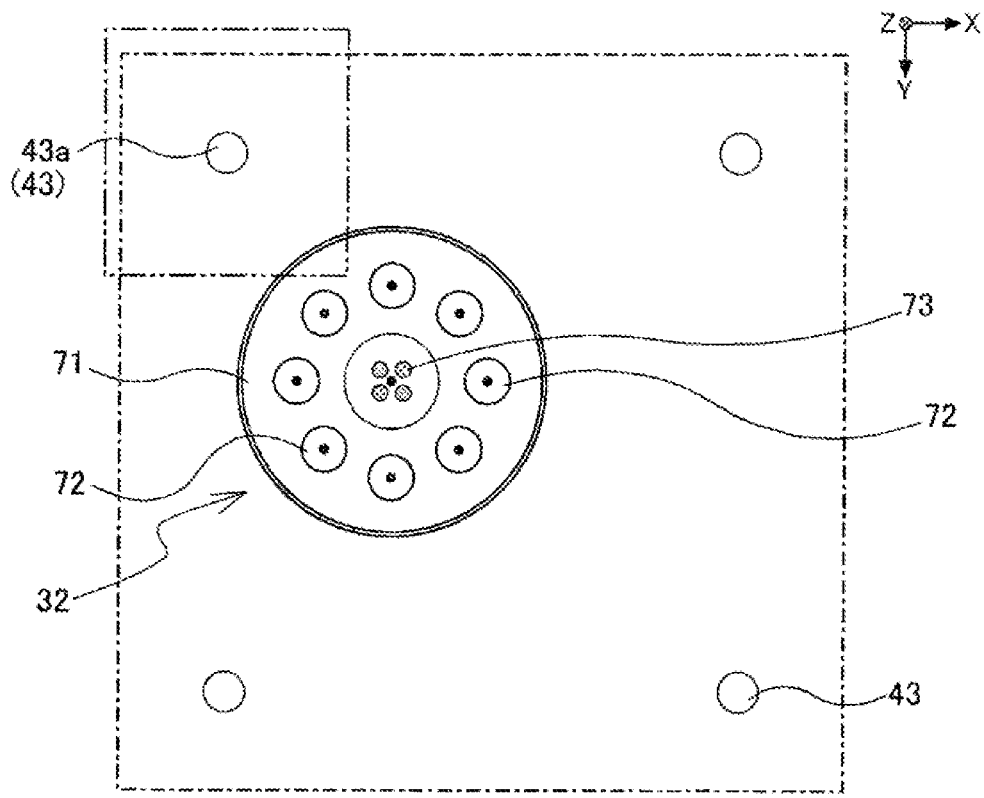
FIG. 6 shows the camera field of view of the component camera when the mounting head is imaged from below by the component camera.

Next, as shown in FIG. 6, control device 100 performs control via component imaging section 131 to capture an image of mounting head 32 from below by component camera 40. Further, first measuring section 133 measures the position coordinates of head marks 73 based on the image data obtained by imaging using component camera 40. Specifically, first measuring section 133 measures the actual position coordinates (X, Y) of head marks 73 with respect to reference marks 43 that are coincident with the optical axis of board camera 50 (hereinafter referred to as "measurement reference mark 43a"). Further, distance L between the actual relative position coordinates (X, Y) and measurement reference mark 43a corresponds to the actual distance between the optical axis of board camera 50 and head mark 73.

Figure 7:
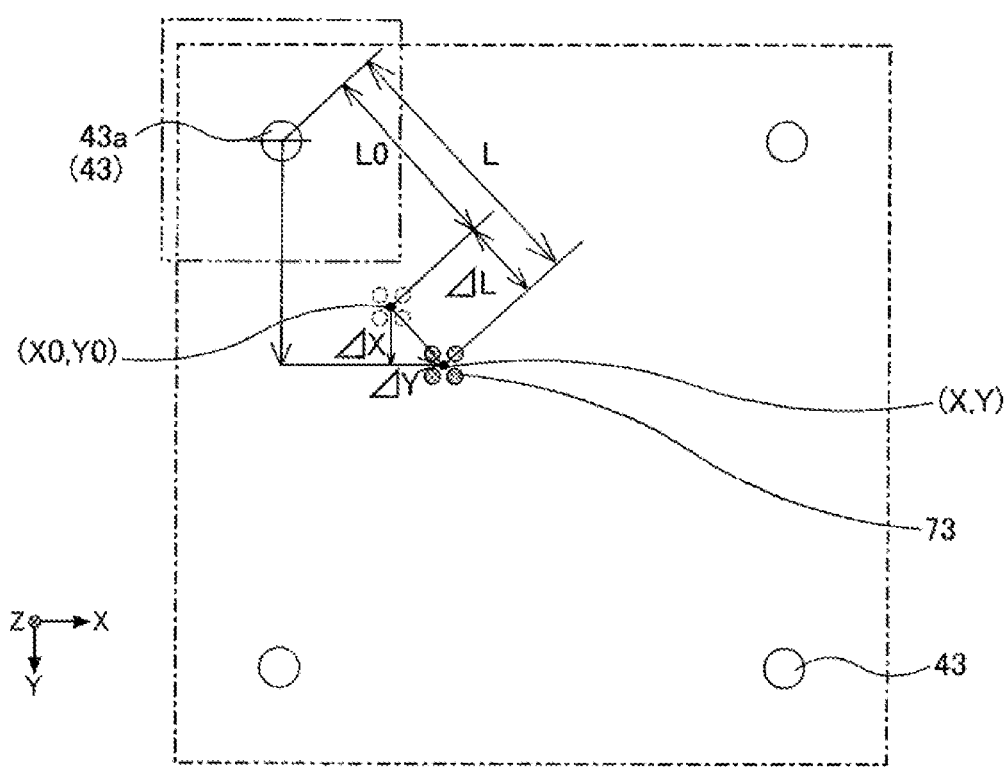
FIG. 7 illustrates a procedure by which a first measuring section measures the position deviation amount between the actual position of the head mark and a theoretical head mark.

Also, as shown in FIG. 7, first measuring section 133 measures the positional deviation ($\Delta X$, $\Delta Y$) between the theoretical relative position (X0, Y0) of head mark 73 calculated based on the relative position coordinates stored in relative position memory section 111 and the actual relative position (X, Y) of head mark 73 measured by first measuring section 133. Note that, the distance between the theoretical relative position coordinates (X0, Y0) and measured reference mark 43a corresponds to the theoretical distance L0 between the optical axis of board camera 50 and head mark 73, and the difference between the actual distance L and the theoretical distance L0 corresponds to a change amount ($\Delta L$) of the distance between board camera 50 and mounting head 32 caused by the thermal deformation of component transfer device 30. Further, image processing section 130 corrects the relative position coordinates stored in relative position memory section 111 based on the positional deviation amounts ($\Delta X$, $\Delta Y$) measured by first measuring section 133.

4. Correction of Imaging Position Coordinates

Next, with reference to FIGS. 8 and 9, an example of a procedure for correcting the imaging position coordinates performed by second measuring section 134 will be described. Note that, in FIG. 9, the drawing is simplified with items of mounting head 32 omitted except for head marks 73.

Figure 8:
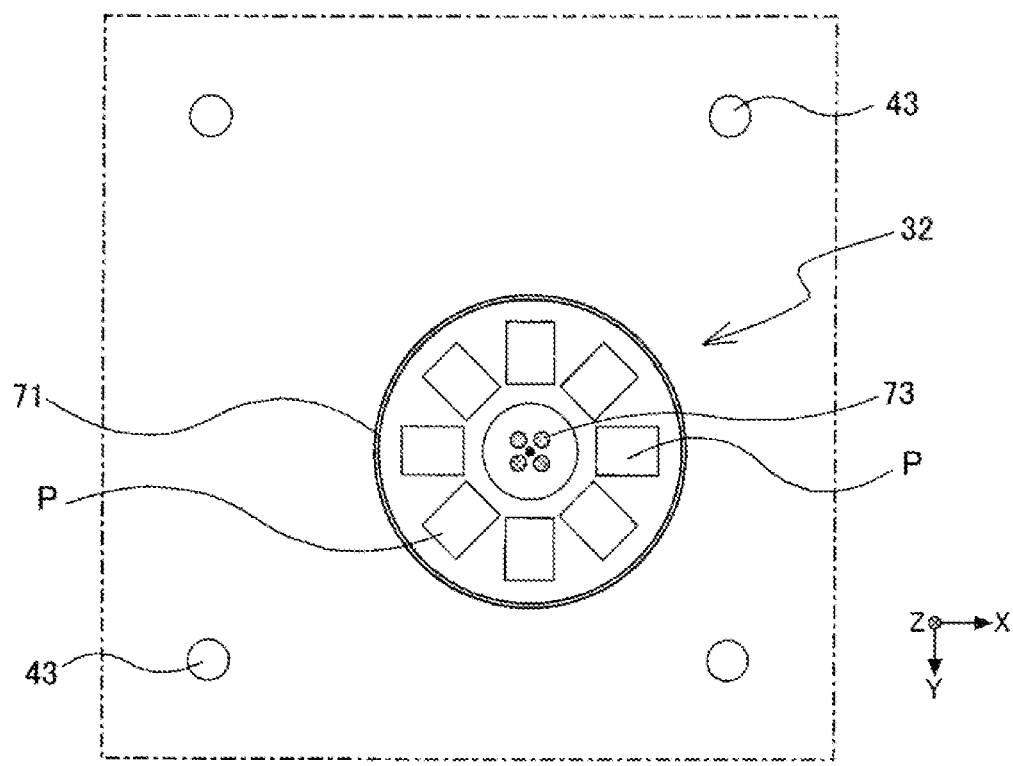
FIG. 8 shows the camera field of view of the component camera when the mounting head is imaged from below by the component camera while the component holding section is holding a component.

As shown in FIG. 8, in correcting the imaging position coordinates, second measuring section 134 measures the position coordinates of head marks 73 based on the image data obtained when mounting head 32 is imaged from below by component camera 40. Specifically, second measuring section 134 measures the actual position coordinates (x, y) of head marks 73 with respect to reference marks 43 based on the image data obtained when component camera 40 images component P held by component holding section 72.

Figure 9:
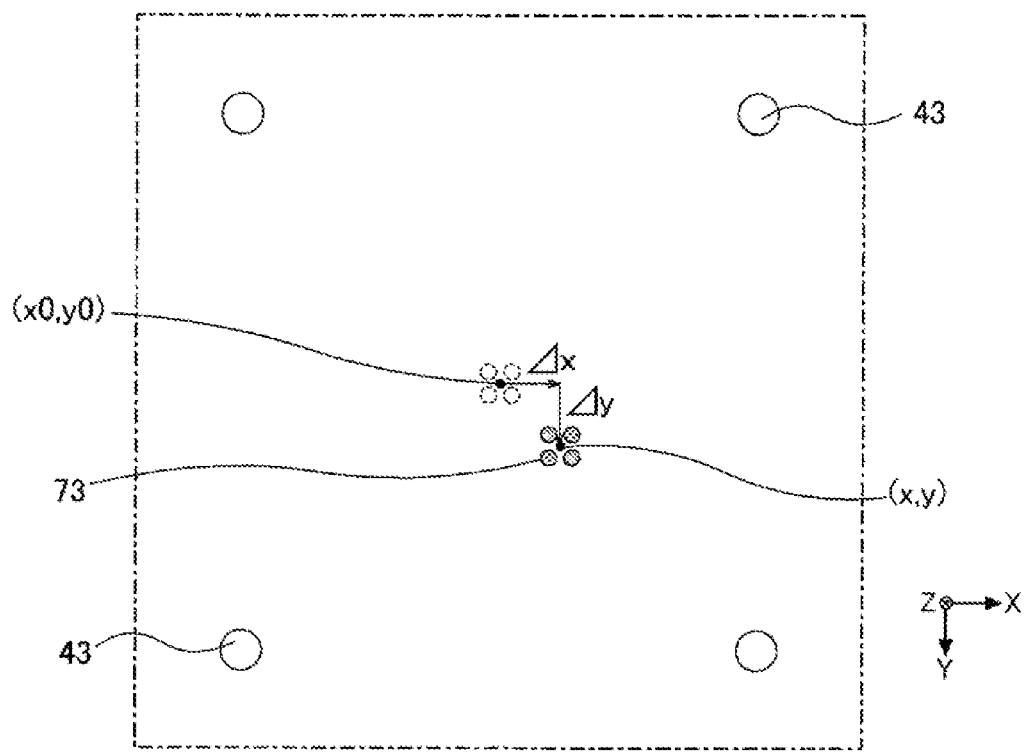
FIG. 9 illustrates a procedure by which a second measuring section measures the position deviation amount between the actual position of the head mark and a theoretical head mark.

Further, as shown in FIG. 9, second measuring section 134 measures the positional deviation ($\Delta x$, $\Delta y$) between the theoretical relative position (x0, y0) of head mark 73 calculated based on the relative position coordinates stored in relative position memory section 111 and the actual relative position (x, y) of head mark 73 measured by second measuring section 134. Also, image processing section 130 corrects the relative position coordinates stored in imaging position memory section 112 based on the positional deviation amounts ($\Delta x$, $\Delta y$) measured by second measuring section 134.

Here, imaging of mounting head 32 by component camera 40 is performed each time mounting head 32 moves from the component supply position to circuit board K. Therefore, control device 100 can perform the correction of the imaging position coordinates each time a supplied component P is mounted on circuit board K, and component mounting machine 1 can perform the correction of the imaging position coordinates in parallel with the mounting operation of component P.

As a result, component mounting machine 1 can image the component P using component camera 40 while the component P is at a position suitable for the imaging conditions of component camera 40 when component camera 40 images the component P. That is, it is possible to suppress a difference in the image data obtained by the imaging of component camera 40 due to a difference in the state of the light applied to component P at the time of imaging by component camera 40 or a difference in the distortion of the lens of component camera 40. Therefore, control device 100 can accurately grasp the orientation of component P held by component holding section 72 and the positional deviation with respect to component holding section 72.

On the other hand, with component mounting machine 1, the imaging of reference marks 43 by board camera 50 (see FIG. 5) is performed separately from the mounting operation of components P, and relative position coordinates cannot be corrected in parallel with mounting operation of components P. Therefore, component mounting machine 1 needs to temporarily suspend mounting operation of components P when correcting the relative position coordinates.

For this, imaging processing section 130 includes correction necessity determining section 135 for determining the necessity of correcting the relative position coordinates. Correction necessity determining section 135 determines that correction of the relative position coordinates stored in relative position memory section 111 is necessary when the positional deviation measured by second measuring section 134 exceeds predetermined threshold th.

Imaging position memory section 112 includes correction position memory section 113 and reference coordinate memory section 114. Correction position memory section 113 stores the imaging position coordinates corrected based on the measurement result by second measuring section 134. When capturing an image of component P held by component holding section 72 using component camera 40, control device 100 performs control via mounting control section 120 to move moving device 31 to the imaging position coordinates stored in correction position memory section 113. Then, when moving device 31 reaches the imaging position coordinates, component imaging section 131 captures an image of mounting head 32 from below using component camera 40, and grasps the position of head marks 73 provided on mounting head 32 based on the image data obtained by the imaging.

Reference coordinate memory section 114 stores the imaging position coordinates stored in correction position memory section 113 when first measuring section 133 measures the relative position coordinates as the reference coordinates. First measuring section 133 calculates the theoretical relative positions (X0, Y0) of head marks 73 based on the reference coordinates stored in reference coordinates memory section 114.

5. Measurement Timing of the Relative Position Coordinates

Figure 10:
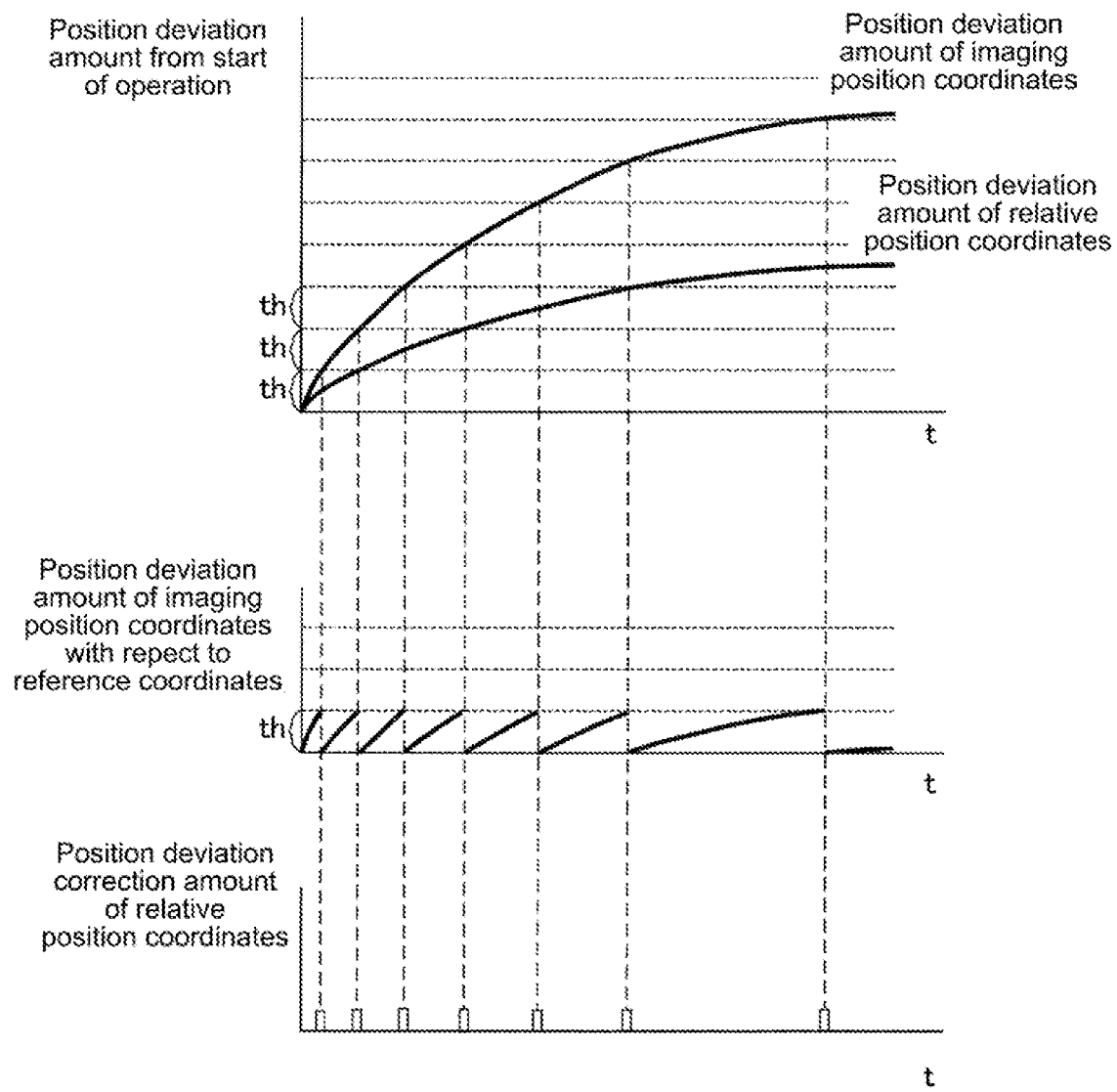
FIG. 10 shows a relationship between a mounting operation time of a component by component mounting machine and a positional deviation amount of an imaging position coordinate and a position deviation amount of a relative position coordinate and a position deviation correction amount of a relative position coordinate.

Here, the measurement timing of the relative position coordinates will be described. As shown in FIG. 10, the amount of positional deviation of the imaging position of component camera 40 and the amount of change in the distance between board camera 50 and mounting head 32 due to thermal deformation of component transfer device 30 are larger at the beginning of mounting operation of components P by component mounting machine 1, and become smaller as time elapses. In this respect, there is a causal relation between the amount of positional deviation of the imaging position of component camera 40 and the amount of change in the distance between board camera 50 and mounting head 32.

Further, the amount of change in the distance between board camera 50 and mounting head 32 is smaller than the amount of positional deviation of the imaging position of component camera 40. Therefore, component mounting machine 1 corrects the relative position coordinates when the positional deviation of the actual position coordinates of moving device 31 with respect to the reference coordinates of moving device 31 exceeds the threshold th while correcting the component imaging position in parallel with the mounting operation of component P.

By correcting the relative position coordinates such that the reference coordinates of moving device 31 coincide with the actual position coordinates of moving device 31, the positional deviation of the actual position coordinates of moving device 31 with respect to the reference coordinates of moving device 31 is eliminated, meaning that the value of threshold value th is reset. Thereafter, component mounting machine 1 corrects the relative position coordinates whenever the amount of positional deviation of the actual position coordinates of moving device 31 with respect to the reference coordinates of moving device 31 exceeds the threshold th.

Here, the amount of thermal deformation of component transfer device 30 is larger at the beginning of the mounting operation of components P by component mounting machine 1, and becomes smaller as the elapsed time from the start of mounting operation becomes longer. With respect to this, since correction necessity determining section 135 determines that the correction of the relative position coordinates is necessary when the amount of positional deviation of the actual position coordinates of moving device 31 with respect to the reference coordinates of moving device 31 exceeds the threshold th, the timing at which the correction of the relative position coordinates is performed can be changed in accordance with the amount of thermal deformation of component transfer device 30. Therefore, component mounting machine 1 can efficiently perform the mounting operation of components P while correcting the relative position coordinates at appropriate timings.

Note that, in the example shown in FIG. 10, the threshold th is a constant value, but the threshold th may be changed according to the elapsed time from the start of mounting operation of components P by component mounting machine 1, the number of corrections of the relative position coordinates, and the like. For example, when the relationship between the positional deviation amount of the imaging position coordinates and the positional deviation amount of the relative position coordinates is observed for each elapsed time from the start of mounting operation, it is conceivable that a difference occurs in the increase rate of both the positional deviation amounts. In such cases, by providing a difference between the threshold th set at the beginning of mounting operation and the threshold th set after a predetermined period of time has elapsed from the start, component mounting machine 1 can correct the relative position coordinates at an appropriate timing while efficiently performing mounting operation of components P.

6. Correction Processing 6-1: Outline of Correction Processing

Figure 11:
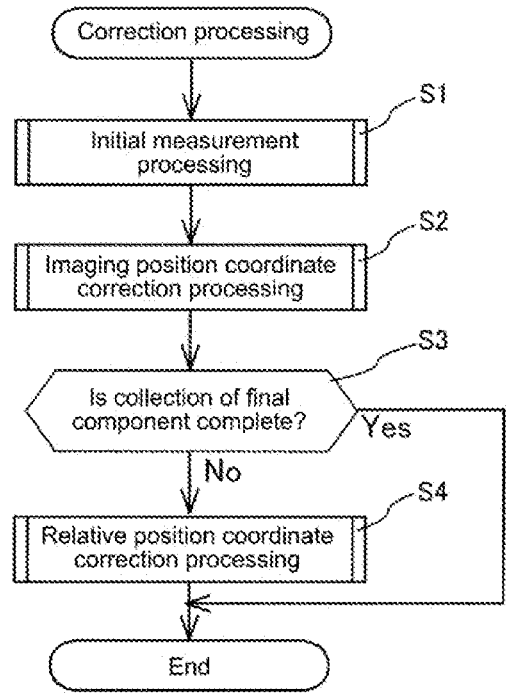
FIG. 11 is a flowchart of correction processing executed by a control device.

Next, referring to the flow chart shown in FIG. 11, an outline of correction processing executed by imaging processing section 130 will be described. As shown in FIG. 11, during correction processing, initial measurement processing (S1) is performed first. Initial measurement processing (S1) is processing executed prior to starting mounting processing of components P by component mounting machine 1.

During correction processing, after initial measurement processing (S1) is performed, imaging position coordinate correction processing (S2) is performed. Imaging position coordinate correction processing (S2) is processing performed after the collection of component P supplied to the component supply position is completed during mounting operation of components P. During correction processing, after imaging position coordinate correction processing (S2) has been performed, it is determined whether the collection of the last component P scheduled in the control program or the like has been completed (S3). Then, when all the scheduled components P have been collected (S3: yes), correction processing ends the present processing as is. On the other hand, if the collection of all the scheduled components P has not been completed (S3: no), the correction processing is followed by relative position coordinate correction processing (S4: correction necessity determining processing). The relative position coordinate correction processing (S4) is processing of performing correction of relative position coordinates as necessary.

Note that, the positional correction of moving device 31 at the time of imaging by component camera 40 and board camera 50, which is executed during correction processing, is performed not only by correcting positional deviation caused by thermal deformation but also by correcting positional deviation caused by backlash or the like.

6-2: Initial Measurement Processing

Figure 12:
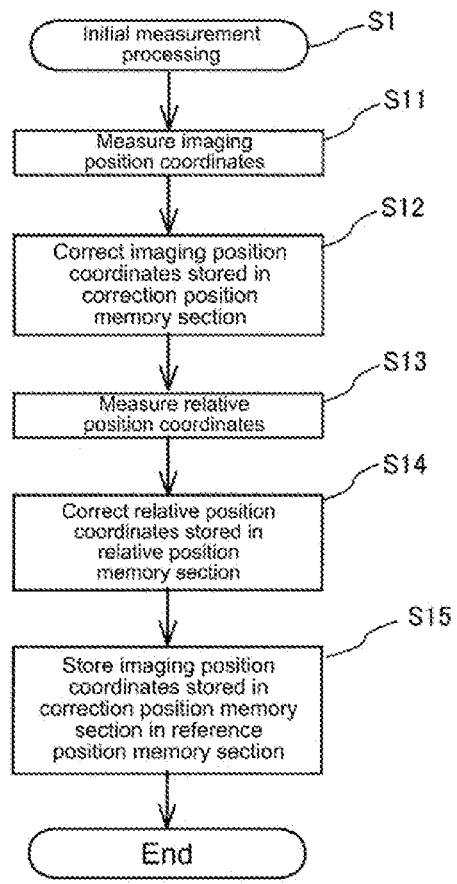
FIG. 12 is a flowchart of initial measurement processing executed during correction processing.

Next, an initial measurement process (S1) performed during correction processing will be described with reference to the flowchart shown in FIG. 12.

In initial measurement processing (S1), first, the imaging position coordinates are measured (S11: an example of imaging position coordinates memory processing), and the position of head mark 73 is made to coincide with the optical axis of component camera 40. Specifically, during processing of S11, image processing section 130 performs imaging using component camera 40 while moving the moving device 31 to the imaging position coordinates stored in correction value position memory section 113 of imaging position memory section 112 (see FIG. 8). Then, second measuring section 134 measures the positional deviation between the actual position of head mark 73, which is grasped from the image data obtained by imaging by component camera 40, and the theoretical position of head mark 73, which is calculated based on the correction position coordinates stored in the correction position memory section 113 (see FIG. 9). Thereafter, during initial measurement processing (S1), the corrected imaging position coordinates are stored in correction position memory section 113 based on the positional deviation measured by second measurement section 134 (S12: imaging position coordinates memory process).

Next, in initial measurement processing (S1), the relative position coordinates are measured (S13: measurement process), and the distance between board camera 50 and mounting head 32 is grasped. Specifically, during processing of S13, first measuring section 133 performs imaging using component camera 40 while the optical axis of the board camera 50 is coaxially arranged with measurement reference mark 43*a* (see FIG. 6). Then, first measuring section 133 measures the positional deviation between the theoretical position of head mark 73 calculated based on the relative position coordinates stored in relative position memory section 111 (the relative position coordinates stored as the default values, the relative position coordinates stored at the time of the previous mounting operation of component P, or the like) and the actual position of head mark 73 measured by first measuring section 133 (see FIG. 7).

Thereafter, during initial measurement processing (S1), the corrected relative position coordinates are stored in relative position memory section 111 based on the positional deviation measured by first measuring section 134 (S14: relative position coordinates memory process). Subsequently, during initial measurement processing (S1), the imaging position coordinates stored in correction position memory section 113 are stored in reference coordinates memory section 114 (S15), and processing is terminated.

6-3: Imaging Position Coordinate Correction Processing

Next, imaging position coordinate correction processing (S2) performed during correction processing will be described with reference to the flowchart shown in FIG. 13.

Figure 13:
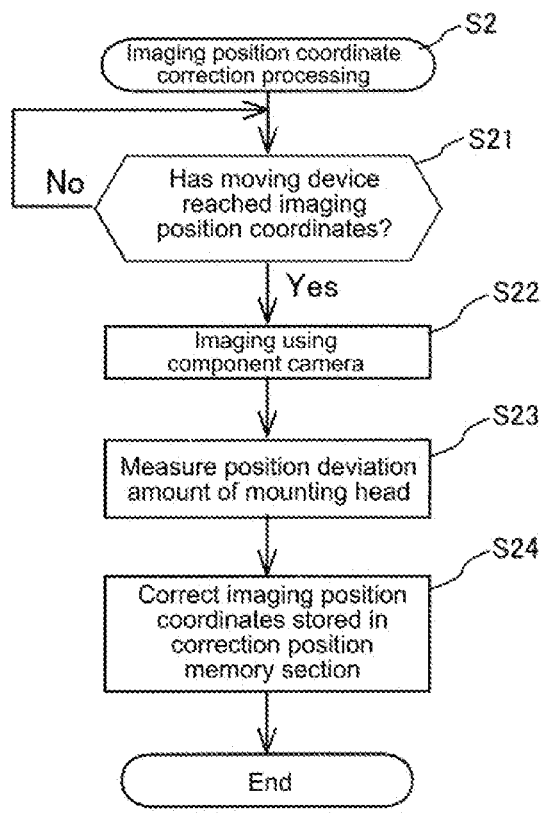
FIG. 13 is a flowchart of imaging position coordinate correction processing executed during correction processing.

As shown in FIG. 13, imaging position coordinate correction processing (S2) determines whether moving device 31 has reached the imaging position coordinates stored in correction position memory section 113 (S21). Processing of S21 is performed repeatedly until moving device 31 reaches the imaging position coordinates. Then, during imaging position coordinate correction processing (S2), when it is determined that moving device 31 has reached the imaging position coordinates (S21: yes), control is performed by component imaging section 131 such that imaging by component camera 40 is performed (S22: component imaging process).

After the processing of S22, imaging position coordinate correction processing (S2) calculates the positional deviation of mounting head 32 (S23: measurement process). Specifically, during processing of S23, second measuring section 134 measures the positional deviation between the actual position of head mark 73, which is grasped from the image data obtained in the processing of S22, and the theoretical position of head mark 73, which is calculated based on the imaging position coordinates stored in correction position memory section 113. Next, imaging position coordinate correction processing (S2) corrects the imaging position coordinates stored in correction position memory section 113 based on the positional deviation measured by second measuring section 134 in the processing of S23 (S24), then terminates processing.

6-4: Relative Position Coordinate Correction Processing

Next, relative position coordinate correction processing (S4) performed during correction processing will be described with reference to the flowchart shown in FIG. 14.

Figure 14:
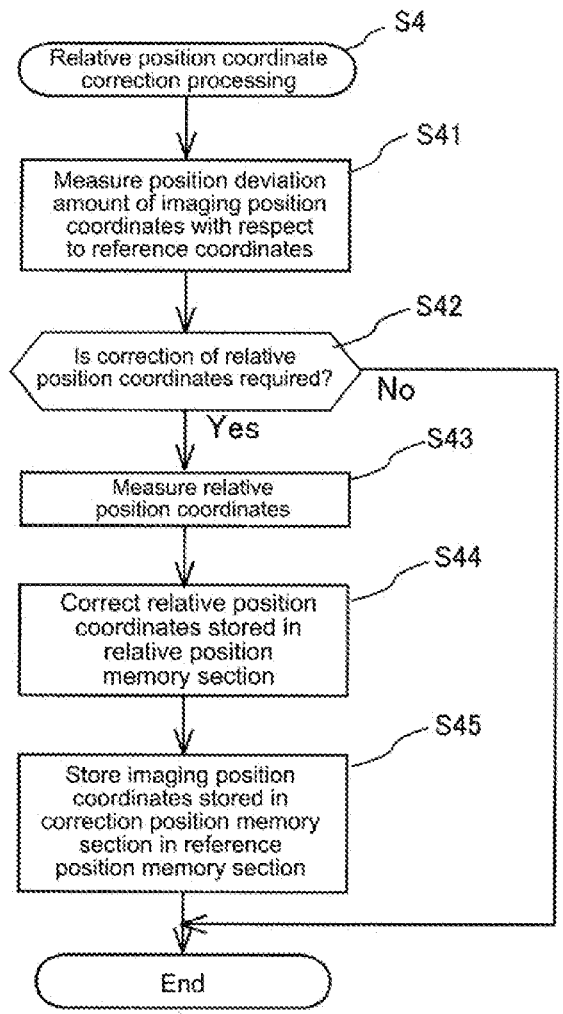
FIG. 14 is a flowchart of relative position coordinate correction processing executed during correction processing.

As shown in FIG. 14, relative position coordinate correction processing (S4) first measures the positional deviation amount of the imaging position coordinates with respect to the reference coordinates (S41). Specifically, during processing of S41, second measuring section 134 measures the positional deviation between the actual position of head mark 73, which is grasped from the image data obtained in the processing of S22, and the theoretical position of head mark 73, which is calculated based on the reference coordinates stored in reference coordinates memory section 114.

Next, relative position coordinate correction processing (S4) determines whether the relative position coordinates need to be corrected (S42: correction necessity determining process). Specifically, correction necessity determining section 135 determines whether the positional deviation measured by second measuring section 134 in the processing of S41 exceeds predetermined threshold th. During processing of S42, if the amount of positional deviation measured by second measuring section 134 does not exceed the predetermined threshold th (S42: no), the relative position coordinate correction processing (S4) determines that it is not necessary to perform correction of the relative position coordinates, and ends processing as is.

On the other hand, during processing of S42, when the amount of positional deviation measured by second measuring section 134 exceeds the threshold th (S42: yes), the relative position coordinate correction processing (S4) measures the relative position coordinates (S43). Specifically, first measuring section 133 measures the positional deviation between the actual relative position of head mark 73, which is grasped from the image data obtained in the above-described processing of S22, and the theoretical relative position of head mark 73, which is calculated based on the relative position coordinates stored in relative position memory section 111 (see FIGS. 5 to 7).

Next, relative position coordinate correction processing (S4) corrects the relative position coordinates stored in relative position memory section 111 based on the positional deviation measured by second measuring section 134 in the processing of S43 (S44). Continuing, relative position coordinate correction processing (S4) stores the imaging position coordinates stored in correction position memory section 113 in reference coordinates memory section 114 (S45). By the processing of S45, the positional deviation amount of the imaging position coordinates with respect to the reference coordinates is reset, as shown in FIG. 10. After the processing of S45, relative position coordinate correction processing (S4) ends processing.

As described above, correction necessity determining section 135 performs imaging of mounting head 32 using component camera 40 when moving device 31 reaches the imaging position coordinates, and determines the correction necessity of the relative position coordinates based on the position of mounting head 32 grasped from the image data obtained by the imaging. Since component mounting machine 1 can correct the relative position coordinates at an appropriate timing, mounting operation of components P can be efficiently performed.

When correction necessity determining section 135 determines the correction necessity of the relative position coordinates, second measuring section 134 measures the positional deviation between the actual position of head mark 73 of mounting head 32 and the theoretical position of head mark 73 of mounting head 32 calculated based on the imaging position coordinates. Further, correction necessity determining section 135 determines that the correction of the relative position coordinate is necessary when the amount of positional deviation between the actual position of mounting head 32 and the position of mounting head 32 calculated based on the reference coordinates exceeds preset threshold th based on the amount of positional deviation measured by second measuring section 134. As a result, component mounting machine 1 can correct the relative position coordinates at an appropriate timing.

7. Other

Although the component mounting machine and the component mounting methods disclosed in the present specification have been described based on the above-described embodiments, the present disclosure is not limited to the above-described embodiments, and it can be easily inferred that various modifications and improvements can be made without departing from the spirit of the present disclosure.

For example, in an embodiment described above, image processing section 130 corrects the component imaging position every time imaging is performed by component camera 40 during mounting operation of components P by component mounting machine 1, but the present disclosure is not limited thereto. That is, the component imaging coordinates may be corrected when the positional deviation between the actual position and the theoretical position of head mark 73 at the time of imaging by component camera 40 exceeds a predetermined threshold value. In this case, the threshold value used for the correction necessity determination of the component imaging coordinates may be the same as the threshold value used for the correction necessity determination of the relative position coordinates, and when correction necessity determining section 135 determines that correction of the relative position coordinates is necessary, the correction of the imaging position coordinates may be performed together with the correction of the relative position coordinates.

Further, in the present embodiment, first measuring section 133 and second measuring section 134 measure the positional deviation amount with reference to head mark 73, but the positional deviation amount may be measured with reference to component holding section 72 instead of head mark 73.

REFERENCE SIGNS LIST

1: component mounting machine;
31: moving device;
32: mounting head;
40: component camera;
50: board camera;
111: relative position memory section;
112: imaging position memory section;
114: reference coordinate memory section;
134: second measuring section (measuring section);
135: correction necessity determining section;
K: circuit board;
P: component;
th: threshold;
S12: imaging position coordinate memory process;
S14: relative position coordinate memory process;
S22: component imaging process;
S23: measurement process;
S42: correction value necessity determination process

The invention claimed is:

1. A component mounting machine comprising:
a moving device configured to move between a component supply position and a circuit board, the moving device including a motor;
a mounting head provided on the moving device and configured to pick up a component supplied to the component supply position and mount the component on the circuit board;
a component camera configured to image the component held by the mounting head from below the mounting head;
a board camera provided on the moving device and configured to image the circuit board from above;
an imaging position memory configured to memorize imaging position coordinates that are position coordinates of the moving device during imaging by the component camera, based on images acquired by imaging of the mounting head by the component camera;
a relative position memory configured to memorize relative position coordinates that are relative position of a mark on the mounting head with respect to the board camera; and
processing circuitry configured to
control the moving device to move the mounting head to the imaging position coordinates,
perform imaging of the mounting head at the imaging position coordinates by the component camera, and
determine whether to correct the relative position coordinates memorized in the relative position memory based on the position coordinates of the mounting head determined from the images.

2. The component mounting machine according to claim 1, further comprising:
a measuring section of the processing circuitry configured to measure a positional deviation amount between actual position coordinates of the mounting head and the relative position coordinates of the mounting head based on the imaging position coordinates,
wherein the processing circuitry is configured to determine whether to correct the relative position coordinates memorized in the relative position memory based on the positional deviation amount measured by the measuring section.

3. The component mounting machine according to claim 2, wherein
the imaging position memory includes a reference coordinates memory configured to memorize the imaging position coordinates from when the relative position coordinates were measured as reference coordinates, and
the processing circuitry corrects the relative position coordinates in a case in which the positional deviation amount between the actual position coordinates of the mounting head and the imaging position coordinates of the mounting head calculated based on reference coordinates exceeds a preset threshold.

4. A component mounting method for a component mounting machine including a moving device configured to move between a component supply position and a circuit board, the moving device including a motor, a mounting head provided on the moving device and configured to pick up a component supplied to the component supply position and mount the component on the circuit board, a component camera configured to image the component held by the mounting head from below the mounting head, and a board camera provided on the moving device and configured to image the circuit board from above, the component mounting method comprising:
- an imaging position coordinates memory process of memorizing imaging position coordinates that are position coordinates of the moving device during imaging by the component camera, based on images acquired by imaging of the mounting head by the component camera;
- a relative position coordinates memory process of memorizing relative position coordinates that are a relative position of a mark on the mounting head with respect to the board camera;
- a component imaging process of performing imaging of the mounting head using the component camera when the moving device has arrived at the imaging position coordinates; and
- a correction necessity determining process determines whether to correct the relative position coordinates based on the position of the mounting head determined from the images.

5. The component mounting method according to claim 4, further comprising:
- a measuring process of measuring a positional deviation amount between actual position coordinates of the mounting head determined from the images and the position coordinates of the mounting head calculated based on the relative position coordinates,
- wherein the correction necessity determining process determines whether to correct the relative position coordinates based on the positional deviation amount measured by the measuring process.

* * * * *